(12) United States Patent
Daede et al.

(10) Patent No.: US 8,473,884 B2
(45) Date of Patent: Jun. 25, 2013

(54) SLACK-BASED TIMING BUDGET APPORTIONMENT

(75) Inventors: Ronald J. Daede, Rochester, MN (US); Timothy D. Helvey, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/548,916

(22) Filed: Jul. 13, 2012

(65) Prior Publication Data

US 2012/0284677 A1  Nov. 8, 2012

Related U.S. Application Data

(63) Continuation of application No. 12/944,493, filed on Nov. 11, 2010, now Pat. No. 8,250,509.

(51) Int. Cl.
*G06F 9/455* (2006.01)
*G06F 17/50* (2006.01)

(52) U.S. Cl.
USPC ............................ 716/108; 716/113; 716/134

(58) Field of Classification Search
USPC .......................................... 716/108, 113, 134
See application file for complete search history.

(56) References Cited

U.S. PATENT DOCUMENTS

| | | | |
|---|---|---|---|
| 5,778,216 A | 7/1998 | Venkatesh | |
| 5,787,268 A * | 7/1998 | Sugiyama et al. | 716/108 |
| 6,836,753 B1 | 12/2004 | Silve | |
| 2008/0307374 A1 | 12/2008 | Gregerson et al. | |
| 2008/0320420 A1 | 12/2008 | Sferrazza | |
| 2009/0037860 A1 | 2/2009 | Kanno | |
| 2009/0241079 A1 | 9/2009 | Binder et al. | |
| 2009/0271746 A1 | 10/2009 | Drapa | |
| 2012/0102448 A1 * | 4/2012 | Haugestuen et al. | 716/134 |

OTHER PUBLICATIONS

U.S. Patent and Trademark Office, Office Action issued in related U.S. Appl. No. 12/944,493, dated Mar. 1, 2012.
U.S. Patent and Trademark Office, Notice of Allowance issued in related U.S. Appl. No. 12/944,493, dated Apr. 16, 2010.

* cited by examiner

*Primary Examiner* — Suresh Memula
(74) *Attorney, Agent, or Firm* — Wood, Herron & Evans, LLP (57) ABSTRACT

A slack-based timing budget apportionment methodology relies not only upon timing analysis-based determinations of slack in the units in an integrated circuit design, but also potential performance optimization opportunities in the logic used to implement such circuits. Logic in various units of an integrated circuit design that is amenable to being replaced with comparatively faster logic may be identified during timing budget apportionment, such that the magnitude of the slack reported for those units can be adjusted to account for such potential performance improvements. Then, when timing budgets are reapportioned using the slack calculated for each unit, additional slack is available to be reapportioned to those units needing larger timing budgets.

23 Claims, 4 Drawing Sheets

SLACK-BASED TIMING BUDGET APPORTIONMENT

CROSS-REFERENCE TO RELATED APPLICATIONS

This application is a continuation of U.S. patent application Ser. No. 12/944,493, filed on Nov. 11, 2010 by Ronald J. Daede et al. (ROC920100182US1), the entire disclosures of which are incorporated by reference herein.

FIELD OF THE INVENTION

The invention is generally related to computers and computer software, and in particular, to computer software used in integrated circuit device design and timing analysis therefor.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate hundreds of millions of transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodologies used for integrated circuit chips. Rather than manually laying out individual transistors or logic gates in a design to obtain a desired logic function, typically the functional aspects of the design process are separated from the physical aspects. The functional aspects of a design are typically addressed via a process known as a logic design, which results in the generation of a functional definition of a circuit design, typically defined in a hardware description language (HDL) such as VHDL or Verilog. An HDL representation of a circuit is analogous in many respects to a software program, as the HDL representation generally defines the logic or functions to be performed by a circuit design. Moreover, by separating logic design from physical layout, functions are capable of being defined at a higher level of abstraction. Many design methodologies rely on the concept of hierarchical logic design, where circuits are defined in units and grouped together in one or more parent containers representing collections of units performing higher level functions.

In parallel with the creation of the HDL representation, a physical definition of a circuit design is created typically via a layout process, often referred to as integration, to essentially create a "floor plan" of logic gates and interconnects between the logic gates representing the actual physical arrangement of circuit elements on the manufactured integrated circuit. Automation tools have been developed to utilize predefined cells or blocks of complete circuits to assist with the layout, thus eliminating the need to work with millions of individual logic gates. For example, synthesis tools have been developed to generate Random Logic Macro (RLM) blocks from an HDL representation of a design, whereby an individual laying out a design is merely required to place the RLM blocks and connect them to one another to complete the circuit design. In addition, some designs incorporate blocks from off-the-shelf (OTS) logic blocks, which are reusable from design to design.

Once a physical definition is created, testing and simulation of the design may be performed to identify any potential timing and/or manufacturability issues, and once the design has been determined to meet these requirements, the design may be utilized to manufacture integrated circuits.

As integrated circuits have become more complex, the number of individuals involved in the development and testing processes has increased substantially. Indeed, in many instances the individuals performing the logic design process are completely separate from the integrators who perform the physical design processes, and different individuals may work on different functional units or circuits within a given design. Furthermore, as integrated circuits have become more complex, larger and faster, timing issues become more pronounced, often necessitating the functional definition of a design to be revised after layout has been performed.

With hierarchical logic design, logic paths often span from one physical unit to another. It is a common task to create a timing budget for each unit and initially apportion time between interconnected units so that the individuals or teams designing different units can design those units to meet expected timing constraints for the overall design. However, it is also common for some units to violate the timing budget, sometimes necessitating redesign of those units or other interconnected units to ensure that the overall timing budget of the circuit is met. Given the complexity of modern designs, however, manually reapportioning a timing budget between various units being developed by different individuals or teams can be extremely difficult to coordinate.

Some automated approaches have been utilized to reapportion unit timing budgets such that a unit, in appropriate circumstances, is able to "steal" time from another unit having extra available time, so that timing budgets are reapportioned somewhat automatically. Some approaches, for example, rely on the concept of "slack," whereby timing analysis is performed on the various units in a design to determine how much those units exceed or fall below their respective timing budgets, then a negotiation algorithm is used to reapportion the timing budgets of the various units. Therefore, whenever one unit exceeds its timing budget (referred to as having "negative slack"), other units that fall below their timing budget (referred to as having "positive slack") can donate time from their time budget to increase the time budget for the unit with negative slack. Timing budgets are therefore reapportioned in an automated manner, resulting in either confirmation that the overall timing budget for the circuit has been met, or identifying units requiring redesign to meet their respective reapportioned timing budgets.

Conventional slack-based approaches, however, are limited in usefulness whenever timing analysis is unable to find any units with sufficient positive slack available to donate time to units with negative slack. Therefore, a significant need exists in the art for a slack-based timing budget apportionment process that identifies additional opportunities for apportioning slack between different units of a design.

SUMMARY OF THE INVENTION

The invention addresses these and other problems associated with the prior art by providing a slack-based timing budget apportionment methodology that relies not only upon timing analysis-based determinations of slack in the units in an integrated circuit design, but also potential performance optimization opportunities in the logic used to implement such circuits. For example, embodiments consistent with the invention may identify logic in various units of an integrated circuit design that is amenable to being replaced with comparatively faster logic, and adjust the magnitude of the slack reported for those units. Then, when timing budgets are reapportioned using the slack calculated for each unit, additional slack is available to be reapportioned to those units needing larger timing budgets.

Consistent with one aspect of the invention, timing budgets in an integrated circuit design are apportioned by determining that at least a portion of logic in a first unit of a plurality of units in the design is capable of being replaced with faster logic using at least one processor; adjusting a calculated slack magnitude for the first unit based at least in part on the faster logic; and reapportioning timing budgets for the plurality of units based at least in part on the adjusted calculated slack for the first unit.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Embodiments consistent with the invention utilize a slack-based timing budget apportionment methodology that relies not only upon timing analysis-based determinations of slack in the units in an integrated circuit design, but also potential performance optimization opportunities in the logic used to implement such circuits. In particular, slack calculated via timing analysis may be selectively adjusted in situations where potential performance optimization opportunities exist in the logic paths for which the slack has been calculated, so that apportionment of timing budgets can take into account such potential performance opportunities. Thus, for example, in embodiments that utilize negotiation-based apportionment algorithms, the magnitudes of the slack offers and/or slack requests may be adjusted to account for potential performance improvements within those units that may represent additional available time that may be transferred between the timing budgets of different units in an integrated circuit design.

In the illustrated embodiments, for example, units are grouped together in parent containers, and parent-level negotiation is employed to apportion timing budgets for the units in a design. A unit, within the context of the invention, may include logic circuitry representing various levels of functionality for an integrated circuit, and typically includes one or more ports providing an interface to other units coupled via logic paths to the unit. Complex units, for example, may include 1000's of logic paths and/or ports coupling to other units in a design. A parent container typically includes two or more units, and in some embodiments, a unit may be embedded within multiple hierarchical layers of containers. In addition, slack is typically calculated for each port of each unit, although not all ports need be analyzed in all embodiments of the invention.

Potential performance optimization opportunities in the logic in a unit may include, for example, logic gates that are capable of being replaced with comparatively faster logic gate implementations, e.g., logic gates that are found to have relatively high voltage thresholds, logic gates that are found to have relatively low drive strength, gates with relatively slow output transition times, etc. In addition, the adjustment of slack in view of such potential performance optimization opportunities may take various forms, e.g., by adding to the timing analysis-determined slack a percentage of a gate delay for any logic gate for which a performance opportunity is identified. Other manners of adjusting the slack, e.g., replacing the gates with faster implementations and retiming, may also be used.

In addition, in the embodiments discussed below, the adjustment of slack to account for potential performance optimization opportunities may be limited to units, or ports in those units, determined to have positive slack. In other embodiments, however, the slack for units and/or ports having negative slack may also be adjusted based upon potential performance optimization opportunities. In addition, an adjustment of slack may be performed in some embodiments after an initial slack value has been calculated via timing analysis. In other embodiments, however, potential performance optimization opportunities may be identified prior to performing timing analysis, and as such, "adjustment" of a slack within the context of the invention does not require that a slack value be calculated via timing analysis prior to analyzing for potential performance optimization opportunities, so long as the slack assigned to a unit and/or port includes a component related to the magnitude of slack calculated via timing analysis and a component associated with one or more potential performance optimization opportunities.

Other variations and modifications will be apparent to one of ordinary skill in the art. Therefore, the invention is not limited to the specific implementations discussed herein.

Hardware and Software Environment

Figure 1:
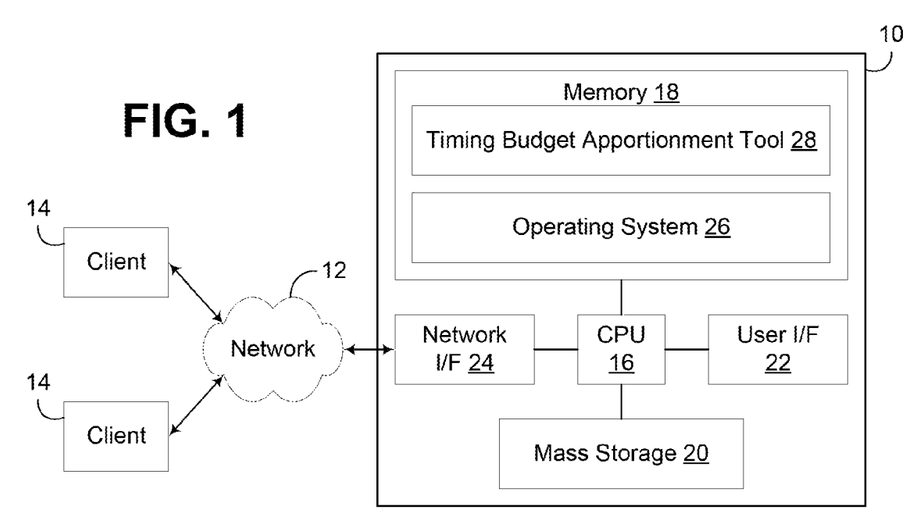
FIG. 1 is a block diagram of the principal hardware components in a computer system suitable for implementing a slack-based timing budget apportionment process consistent with the invention.

Turning now to the drawings, wherein like numbers denote like parts throughout the several views, FIG. 1 illustrates an apparatus 10 within which slack-based timing budget apportionment consistent with the invention may be performed. Apparatus 10 in the illustrated embodiment is implemented as a server or multi-user computer that is coupled via a network 12 to one or more client computers 14. For the purposes of the invention, each computer 10, 14 may represent practically any type of computer, computer system or other programmable electronic device. Moreover, each computer 10, 14 may be implemented using one or more networked computers, e.g., in a cluster or other distributed computing system. In the alternative, each computer 10, 14 may be implemented within a single computer or other programmable electronic device, e.g., a desktop computer, a laptop computer, a handheld computer, a cell phone, a set top box, etc.

Computer 10 typically includes a central processing unit 16 including at least one hardware-based microprocessor coupled to a memory 18, which may represent the random access memory (RAM) devices comprising the main storage of computer 10, as well as any supplemental levels of memory, e.g., cache memories, non-volatile or backup memories (e.g., programmable or flash memories), read-only memories, etc. In addition, memory 18 may be considered to include memory storage physically located elsewhere in computer 10, e.g., any cache memory in a processor in CPU 16, as well as any storage capacity used as a virtual memory, e.g., as stored on a mass storage device 20 or on another computer coupled to computer 10. Computer 10 also typically receives a number of inputs and outputs for communicating information externally. For interface with a user or operator, computer 10 typically includes a user interface 22 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 10 may also include one or more mass storage devices 20, e.g., a floppy or other removable disk drive, a hard disk drive, a direct access storage device (DASD), an optical drive (e.g., a CD drive, a DVD drive, etc.), a storage area network, and/or a tape drive, among others. Furthermore, computer 10 may include an interface 24 with one or more networks 12 (e.g., a LAN, a WAN, a wireless network, and/or the Internet, among others) to permit the communication of information with other computers and electronic devices. It should be appreciated that computer 10 typically includes suitable analog and/or digital interfaces between CPU 16 and each of components 18, 20, 22 and 24 as is well known in the art. Other hardware environments are contemplated within the context of the invention.

Computer 10 operates under the control of an operating system 26 and executes or otherwise relies upon various computer software applications, components, programs, objects, modules, data structures, etc., as will be described in greater detail below (e.g., timing budget apportionment tool 28). Moreover, various applications, components, programs, objects, modules, etc. may also execute on one or more processors in another computer coupled to computer 10 via network 12, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include tangible, recordable type media such as volatile and non-volatile memory devices (e.g., memory 18), floppy and other removable disks, hard disk drives, magnetic tape, and optical disks (e.g., CD-ROMs, DVDs, etc.), among others.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Slack-Based Timing Budget Apportionment

Figure 2:
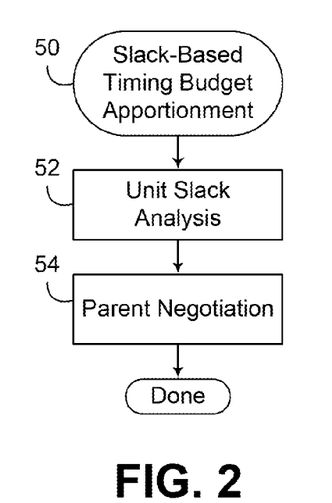
FIG. 2 is a flowchart illustrating the sequence of operations in an exemplary slack-based timing budget apportionment process capable of being implemented in the computer of FIG. 1.

Turning now to FIG. 2, this figure illustrates an exemplary slack-based timing budget apportionment process 50 consistent with the invention, and capable of being implemented within timing budget apportionment tool 28 of FIG. 1. Process 50 incorporates two primary phases, processes, or steps, including a unit slack analysis step 52 and a parent negotiation step 54. The unit slack analysis step calculates the slack requests and offers for each lower level unit, while the parent negotiation step is run on parent-level containers to negotiate slack requests and offers to apportion or reapportion timing budgets for the units involved. Process 50 may be run for all of the units in a design, or only for a subset of units for which it is desired to apportion timing budgets.

Figure 3:
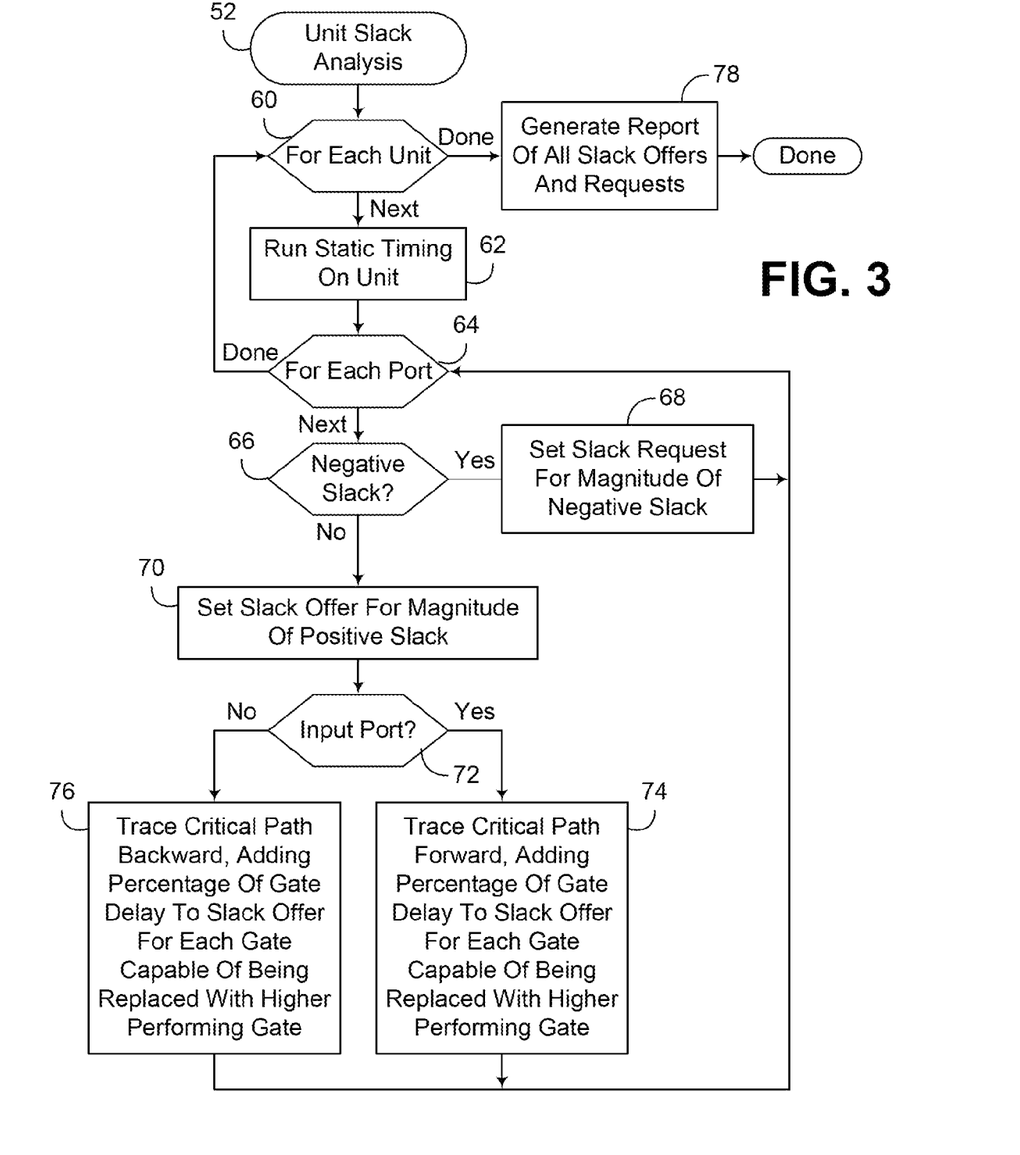
FIG. 3 is a flowchart illustrating the sequence of operations in an exemplary implementation of the unit slack analysis step referenced in FIG. 2.

Unit slack analysis step 52 is illustrated in greater detail in FIG. 3. As shown in block 60, each unit to be analyzed is separately processed, either sequentially or in parallel. In multithreaded implementations, for example, it may be desirable to process each unit in parallel.

For each unit, static timing analysis is run on the unit (block 62) to analyze the critical paths in the unit, resulting in the determination of slack for each port of the unit. The slack may be positive, indicating that the arrival time at that port may be increased by an amount equal to the slack without affecting the overall delay of the circuit. Alternatively, the slack may be negative, indicating that critical path to the port is too slow, and must be sped up (or the reference signal delayed) if the whole circuit is to work at the desired speed. In many embodiments, the positive or negative slack may be calculated in the form of a magnitude or slack value, e.g., using time-based units (e.g., in nanoseconds or picoseconds) with positive values representing positive slack and negative values representing negative slack.

Next, block 64 initiates a FOR loop to process each port in the unit. For each such port, block 66 determines whether the calculated slack for that port is negative. If so, a slack request is generated for the port in block 68 based upon the magnitude of the negative slack, and control is returned to block 64 to process the remaining ports in the unit.

If the slack is zero or positive, block 66 passes control to block 70 to initially generate a slack offer based upon the magnitude of the positive slack, i.e., so the initial offer is set to the static timing analysis-calculated slack value. Block 72 then determines whether the port is an input port or an output port. If an input port, control passes to block 74 to trace the critical path forward in the unit from the port and adjust the positive slack in the slack offer based upon potential performance optimizations that can be made to the logic circuitry in the critical path. Control then returns to block 64 to process the remaining ports.

Returning to block 72, if the port is an output port, control passes to block 76 to trace the critical path backward in the unit from the port and adjust the positive slack in the slack offer based upon potential performance optimizations that can be made to the logic circuitry in the critical path.

Once all ports are processed for a unit, block 64 returns control to block 60. Once all units are processed, block 60 passes control to block 68 to generate a report of all slack offers and requests, whereby process 52 is complete. It will be appreciated that the report generated in block 78 may constitute as little as a data structure that is accessible during the parent-level negotiation step 54. A report may also constitute human-readable material that may be reviewed by developers to identify units timing budget issues in a design.

Returning to blocks 74 and 76, a number of different algorithms may be used to adjust the positive slack for a slack offer consistent with the invention. In one embodiment of the invention, blocks 74 and 76 detect logic gates in the critical path that are capable of being replaced with comparably faster/higher performing logic gates, and adds a percentage (e.g., 10%) of the gate delay for each replaceable logic gate to the slack offer for the port.

In other embodiments, however, a more accurate assessment of the potential increase in positive slack may be calculated, e.g., by adding an amount to the slack based upon the difference between the predicted gate delay of a logic gate and its faster/higher performing counterpart.

In addition, the detection of faster/higher performing logic circuitry may vary in different embodiments. In one embodiment, for example, logic gates are identified as being capable of being replaced with faster logic gates if the logic gates are determined to have a high voltage threshold, a low drive strength, or relatively slow output transition times.

It should also be noted that process 52 of FIG. 3 only adjusts slack for slack offers. In other embodiments, slack may also be adjusted for slack requests, e.g., to reduce the amount of slack requested in a request based upon the predicted ability of logic in a unit to be replaced with faster logic that reduces the negative slack in the unit. In addition, in other embodiments, analysis of critical paths for the purpose of identifying adjustments to positive and/or negative slack based upon potential performance optimization opportunities may be performed prior to static timing analysis of units.

Figure 4:
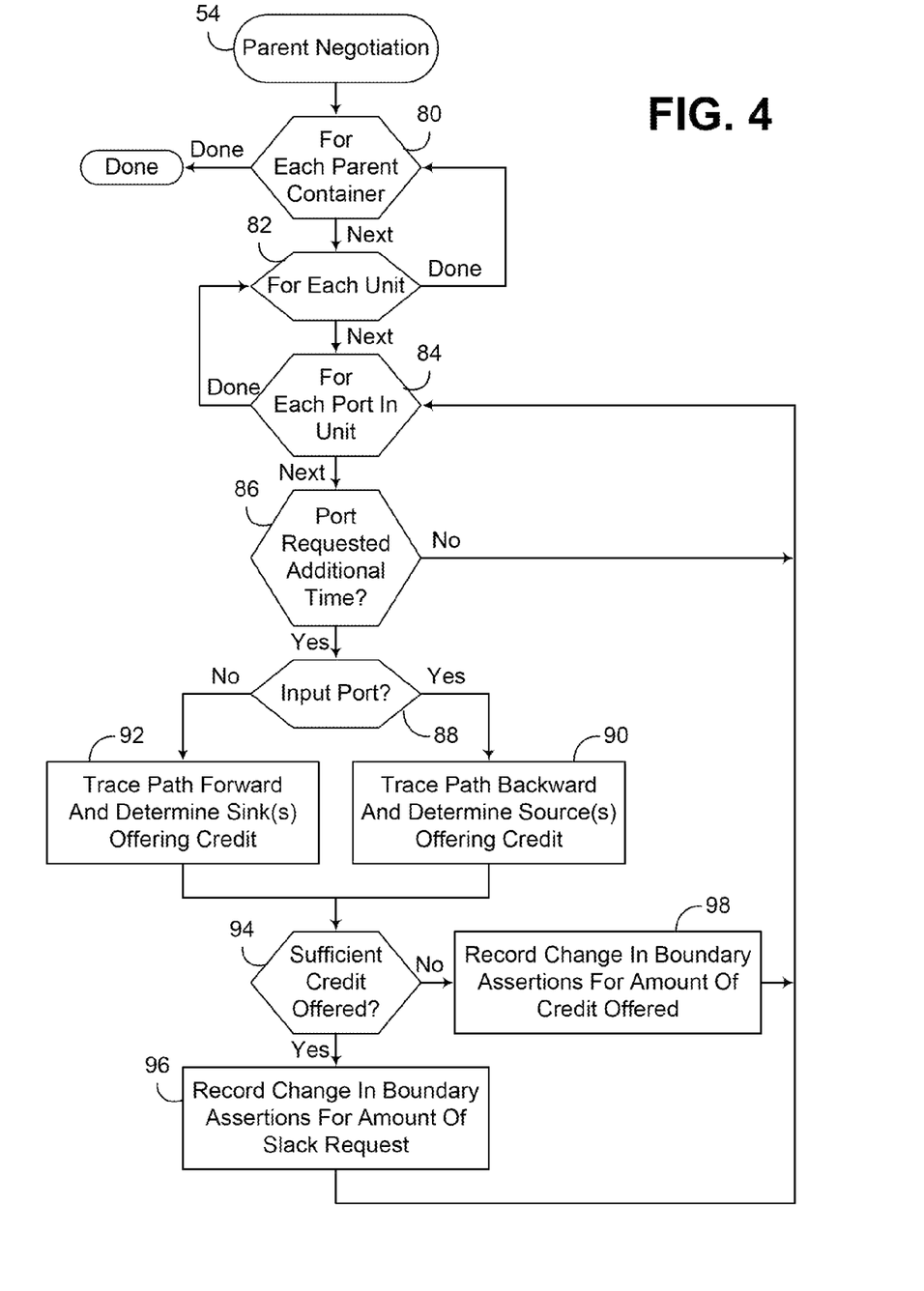
FIG. 4 is a flowchart illustrating the sequence of operations in an exemplary implementation of the parent negotiation step referenced in FIG. 2.

FIG. 4 next illustrates parent-level negotiation step 54 in greater detail. Block 80 initiates a FOR loop to process each parent-level container, block 82 initiates a FOR loop to process each unit in each parent-level container, and block 84 initiates a FOR loop to process each port in each unit. For each such port, block 86 determines whether the port has requested additional time, i.e., has a slack request associated therewith. If not, control returns to block 84 to process additional ports.

If a slack request is associated with the port, however, block 86 passes control to block 88 to determine whether the port is an input port. If so, block 90 traces a path backward from the port and determines whether any sources are offering credit, i.e., whether any unit feeding the input port has an outstanding slack offer. Similarly, if the port is an output port, block 88 passes control to block 92 to trace a path forward from the port and determine whether any sinks are offering credit, i.e., whether any unit downstream of the port has an outstanding slack offer.

Blocks 90 and 92 each pass control to block 94, which determines whether sufficient credit is being offered by the identified units with slack offers (i.e., if each individual upstream source or downstream sink satisfies the request), and if so, passes control to block 96 to record a change in the boundary assertions for the respective units in the amount of the slack request. If insufficient credit is offered, however, block 94 passes control to block 98 to record a change in the boundary assertions for the respective units in the amount of credit offered. In other embodiments, however, the slack offers may be summed to determine whether sufficient overall credit determined from the trace is being offered.

Upon completion of blocks 96 and 98, control returns to block 84 to process additional ports. Once all ports of all units in all parent containers have been processed, process 54 is complete. As a result, the boundary assertions for the units in the parent containers are modified to effectively reapportion the timing budgets for the units.

It will be appreciated that in some instances, the result of process 50 will be new timing budgets that meet all slack requirements. In other instances, it may be desirable to rerun process 50, and if timing budget violations are still present, report such violations to developers so that violating units can be redesigned to meet required timing budgets. As such, it may be desirable in some instances to report the results of process 50 to developers, including identifying violating units in a design and/or the amount of slack associated with specific ports on such units.

In some embodiments, it may also be desirable to identify actual logic gates in a unit that are candidates to be replaced with faster logic. In the alternative, conventional logic optimization tools may be run on units in a design using the new timing budgets such that the units will be re-optimized to meet the new timing budgets.

Figure 5:
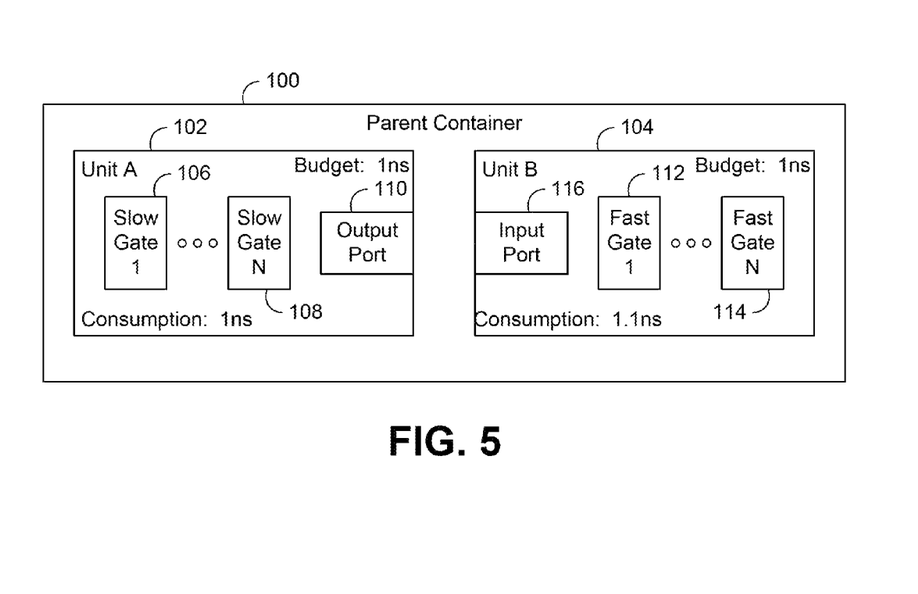
FIGS. 5 and 6 are block diagrams of an parent container in an exemplary integrated circuit design, respectively before and after performing the slack-based timing budget apportionment process referenced in FIG. 2.

As a further illustration of the operation of process 50, FIG. 5 illustrates an exemplary parent container 100 in an exemplary integrated circuit design, incorporating a unit A 102 and unit B 104. Unit A includes a plurality of logic gates 1 . . . N 106, 108 implementing using comparatively slow logic, and coupled to an output port 110. Unit B includes a plurality of logic gates 1 . . . N 112, 114 implementing using comparatively fast logic, and coupled to an input port 116 that is fed by output port 110 of unit A. Port 110 of unit A is illustrated with a timing budget of 1 ns and an actual consumption of 1 ns, while port 116 of unit B is illustrated with a timing budget of 1 ns and an actual consumption of 1.1 ns.

Upon performing process 52 upon units A and B of parent container 100, input port 116 of unit B would be found to need an additional 100 ps to meet its timing budget, and as such would result in the generation of a slack request in the amount of 100 ps. With respect to output port 110 of unit A, static timing analysis performing in block 62 of process 52 would determine that there is no positive slack for the port, as the consumption and the timing budget are both 1 ns. However, blocks 70, 72 and 76 would subsequently be executed for the port, tracing backward along the critical path and identifying one or more logic gates 106, 108 capable of being replaced with faster logic. As a result, the slack offer for port 110 would be increased by a percentage of the gate delay of each logic gate in the critical path capable of being replaced with faster logic. Thus, in contrast to a conventional slack-based approach that relies solely on timing analysis-generated slack offers and requests, embodiments consistent with the invention are able to identify potential performance optimization opportunities and adjust slack offers and/or requests accordingly.

Figure 6:
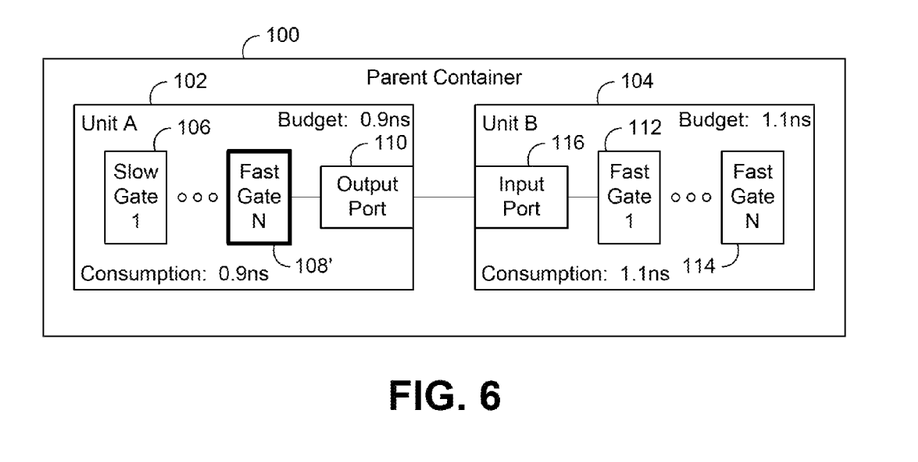

Now turning to FIG. 6, which illustrates the result of process 50 on parent container 100 of FIG. 5, assuming that the amount of the slack offer for output port 110 is sufficient to meet the requirements of the slack request for input port 116, parent-level negotiation performed in step 54 results in a reapportionment of timing budgets between unit A 102 and unit B 104, such that the 100 ps of time has been reapportioned from output port 110 to input port 116, with the consumption of each unit now matching its timing budget. Furthermore, as illustrated by logic gate 108', unit A 102 may be processed by an optimization tool to redesign the unit to meet the (now shorter) timing budget of 0.9 ns, e.g., by replacing slower logic gate 108 with faster logic gate 108'.

Therefore, it can be seen that embodiments consistent with the invention provider greater flexibility for slack-based timing budget apportionment through the identification of potential performance optimization opportunities in an integrated circuit design. Various modifications may be to the illustrated embodiments consistent with the invention. For example, as noted above, potential performance optimization opportunities may be identified for units/ports having negative slack in addition to those having positive slack. In addition, the principles of the invention may be applied to other slack-based timing budget apportionment algorithms than those disclosed herein.

In addition, various other modifications may be made without departing from the spirit and scope of the invention. Therefore, the invention lies in the claims hereinafter appended.

What is claimed is:

1. A method of apportioning timing budgets in an integrated circuit design including a plurality of units, the method comprising:
   using at least one processor, determining that at least a portion of logic in a first unit of the plurality of units is capable of being replaced with faster logic;
   adjusting a calculated slack magnitude for the first unit based at least in part on the faster logic; and
   reapportioning timing budgets for the plurality of units based at least in part on the adjusted calculated slack for the first unit, wherein the first unit is disposed in a parent container, and wherein reapportioning timing budgets for the plurality of units based at least in part on the adjusted calculated slack for the first unit includes performing parent level negotiation based at least in part on generated slack offers.

2. The method of claim 1, wherein determining that at least a portion of logic in the first unit of the plurality of units is capable of being replaced with faster logic includes tracing a critical path in the first unit to identify the at least a portion of logic.

3. The method of claim 2, wherein determining that at least a portion of logic in the first unit of the plurality of units is capable of being replaced with faster logic includes detecting at least one logic gate in the critical path capable of being replaced with a faster logic gate.

4. The method of claim 3, wherein detecting at least one logic gate in the critical path capable of being replaced with a faster logic gate comprises detecting at least one logic gate with a high voltage threshold.

5. The method of claim 3, wherein detecting at least one logic gate in the critical path capable of being replaced with a faster logic gate comprises detecting at least one logic gate with a low drive strength.

6. The method of claim 1, wherein determining that at least a portion of logic in the first unit is capable of being replaced with faster logic is performed only if the calculated slack magnitude of the first unit is positive slack.

7. The method of claim 1, further comprising performing timing analysis on the first unit to calculate the slack magnitude for the first unit.

8. The method of claim 7, wherein performing timing analysis on the first unit to calculate the slack magnitude for the first unit includes calculating a slack value for each port of the first unit.

9. The method of claim 1, further comprising:
   increasing the magnitude in a slack offer for the first unit in response to determining that at least a portion of logic in the first unit is capable of being replaced with faster logic.

10. The method of claim 1, further comprising:
    increasing the magnitude in a slack offer for the first unit based at least in part on the faster logic.

11. The method of claim 1, wherein determining that at least a portion of logic in a first unit of the plurality of units is capable of being replaced with faster logic includes tracing a critical path of the first unit backward from an output port of the first unit.

12. The method of claim 1, wherein determining that at least a portion of logic in a first unit of the plurality of units is capable of being replaced with faster logic includes tracing a critical path of the first unit forward from an input port of the first unit.

13. The method of claim 1, further comprising:
    generating a slack offer for each port of the first unit having a positive slack, wherein each slack offer has a slack value with a magnitude based upon a determined positive slack of the port increase in response to determining that at least a portion of logic in a critical path coupled to the port is capable of being replaced with faster logic.

14. An apparatus, comprising:
    a computer readable storage medium;
    at least one processor; and
    program code stored on the computer readable storage medium and configured upon execution by the at least one processor to apportion timing budgets in an integrated circuit design including a plurality of units, wherein the program code is configured to determine that at least a portion of logic in a first unit of the plurality of units is capable of being replaced with faster logic, adjust a calculated slack magnitude for the first unit based at least in part on the faster logic, and reapportion timing budgets for the plurality of units based at least in part on the adjusted calculated slack for the first unit, wherein the first unit is disposed in a parent container, and wherein the program code is configured to reapportion timing budgets for the plurality of units based at least in part on the adjusted calculated slack for the first unit by performing parent level negotiation based at least in part on generated slack offers.

15. The apparatus of claim 14, wherein the program code is configured to determine that at least a portion of logic in the first unit is capable of being replaced with faster logic by tracing a critical path in the first unit to identify the at least a portion of logic.

16. The apparatus of claim 14, wherein the program code is configured to determine that at least a portion of logic in the first unit is capable of being replaced with faster logic by detecting at least one logic gate in the critical path capable of being replaced with a faster logic gate.

17. The apparatus of claim 14, wherein the program code is configured to determine that at least a portion of logic in the first unit is capable of being replaced with faster logic only if the calculated slack magnitude of the first unit is positive slack.

18. The apparatus of claim 14, wherein the program code is further configured to perform timing analysis on the first unit to calculate the slack magnitude for the first unit.

19. The apparatus of claim 14, wherein the program code is configured to determine that at least a portion of logic in the first unit is capable of being replaced with faster logic by tracing a critical path of the first unit backward from an output port of the first unit.

20. The apparatus of claim 14, wherein the program code is configured to determine that at least a portion of logic in the first unit is capable of being replaced with faster logic by tracing a critical path of the first unit forward from an input port of the first unit.

21. The apparatus of claim 14, wherein the program code is further configured to increase the magnitude in a slack offer for the first unit responsive to determining that at least a portion of logic in the first unit is capable of being replaced with faster logic.

22. The apparatus of claim 14, wherein the program code is further configured to increase the magnitude in a slack offer for the first unit based at least in part on the faster logic.

23. A program product, comprising:
a computer readable medium; and
program code stored on the computer readable medium and configured upon execution to apportion timing budgets in an integrated circuit design, wherein the program code is configured to determine that at least a portion of logic in a first unit of the plurality of units is capable of being replaced with faster logic, adjust a calculated slack magnitude for the first unit based at least in part on the faster logic, and reapportion timing budgets for the plurality of units based at least in part on the adjusted calculated slack for the first unit, wherein the first unit is disposed in a parent container, and wherein the program code is configured to reapportion timing budgets for the plurality of units based at least in part on the adjusted calculated slack for the first unit by performing parent level negotiation based at least in part on generated slack offers.

* * * * *